(12) United States Patent
Brady

(10) Patent No.: US 7,859,033 B2
(45) Date of Patent: Dec. 28, 2010

(54) WAFER LEVEL PROCESSING FOR BACKSIDE ILLUMINATED SENSORS

(75) Inventor: Frederick T. Brady, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 140 days.

(21) Appl. No.: 12/169,791

(22) Filed: Jul. 9, 2008

(65) Prior Publication Data

US 2010/0006963 A1    Jan. 14, 2010

(51) Int. Cl.
*H01L 31/62*    (2006.01)
(52) U.S. Cl. .................. 257/294; 257/431; 257/447; 257/460; 257/E27.133
(58) Field of Classification Search ............. 257/294, 257/431, 447, 460, E27.133
See application file for complete search history.

(56) References Cited

U.S. PATENT DOCUMENTS

| | | | |
|---|---|---|---|
| 5,227,313 | A | 7/1993 | Gluck et al. |
| 5,244,817 | A | 9/1993 | Hawkins et al. |
| 5,969,368 | A | 10/1999 | Thompson et al. |
| 6,168,965 | B1 | 1/2001 | Malinovich et al. |
| 6,429,036 | B1 | 8/2002 | Nixon et al. |
| 7,315,014 | B2 | 1/2008 | Lee et al. |
| 7,615,808 | B2 * | 11/2009 | Pain et al. .................. 257/228 |
| 2006/0068586 | A1 | 3/2006 | Pain |
| 2007/0194397 | A1 | 8/2007 | Adkisson et al. |

FOREIGN PATENT DOCUMENTS

WO    WO2007/030226    3/2007

OTHER PUBLICATIONS

T. Joy et al., "Development of a Production-Ready, Back-Illuminated CMOS Image Sensor with Small Pixels," IEEE IEDM, Dec. 2007, pp. 1007-1010.

* cited by examiner

*Primary Examiner*—Jack Chen
(74) *Attorney, Agent, or Firm*—Nancy R. Simon

(57) ABSTRACT

A backside illuminated image sensor comprises a sensor layer having a plurality of photosensitive elements of a pixel array, an oxide layer adjacent a backside surface of the sensor layer, and at least one dielectric layer adjacent a frontside surface of the sensor layer. A color filter array is formed on a backside surface of the oxide layer, and a transparent cover is attached to the backside surface of the oxide layer overlying the color filter array. Redistribution metal conductors are in electrical contact with respective bond pad conductors through respective openings in the dielectric layer. A redistribution passivation layer is formed over the redistribution metal conductors, and contact metallizations are in electrical contact with respective ones of the respective redistribution metal conductors through respective openings in the redistribution passivation layer. The image sensor may be implemented in a digital camera or other type of digital imaging device.

7 Claims, 10 Drawing Sheets

WAFER LEVEL PROCESSING FOR BACKSIDE ILLUMINATED SENSORS

CROSS REFERENCE TO RELATED APPLICATIONS

The present invention is related to the inventions described in commonly-assigned U.S. patent applications Ser. No. 12/169790, entitled "Color Filter Array Alignment Mark Formation in Backside Illuminated Image Sensors," Ser. No. 12/169,810, entitled "Backside Illuminated Image Sensor with Shallow Backside Trench for Photodiode Isolation," and Ser. No. 12/169,723, entitled "Backside Illuminated Image Sensor with Reduced Dark Current," which are concurrently filed herewith. The disclosures of these related applications are incorporated by reference herein in their entirety.

FIELD OF THE INVENTION

The present invention relates generally to electronic image sensors for use in digital cameras and other types of imaging devices, and more particularly to processing techniques for use in forming backside illuminated image sensors.

BACKGROUND OF THE INVENTION

A typical electronic image sensor comprises a number of light sensitive picture elements ("pixels") arranged in a two-dimensional array. Such an image sensor may be configured to produce a color image by forming an appropriate color filter array (CFA) over the pixels. Examples of image sensors of this type are disclosed in U.S. Patent Application Publication No. 2007/0024931, entitled "Image Sensor with Improved Light Sensitivity," which is incorporated by reference herein.

As is well known, an image sensor may be implemented using complementary metal-oxide-semiconductor (CMOS) circuitry. In such an arrangement, each pixel typically comprises a photodiode and other circuitry elements that are formed in a silicon sensor layer on a silicon substrate. One or more dielectric layers are usually formed above the silicon sensor layer and may incorporate additional circuitry elements as well as multiple levels of metallization used to form interconnects. The side of the image sensor on which the dielectric layers and associated levels of metallization are formed is commonly referred to as the frontside, while the side having the silicon substrate is referred to as the backside.

In a frontside illuminated image sensor, light from a subject scene is incident on the frontside of the image sensor, and the silicon substrate is relatively thick. However, the presence of metallization level interconnects and various other features associated with the dielectric layers on the frontside of the image sensor can adversely impact the fill factor and quantum efficiency of the image sensor.

A backside illuminated image sensor addresses the fill factor and quantum efficiency issues associated with the frontside dielectric layers by thinning or removing the thick silicon substrate and arranging the image sensor such that light from a subject scene is incident on the backside of the image sensor. Thus, the incident light is no longer impacted by metallization level interconnects and other features of the dielectric layers, and fill factor and quantum efficiency are improved.

Backside illuminated image sensors can be difficult to process due to the thinning or removal of the silicon substrate. Important processing issues that are not adequately addressed by conventional techniques include use and attachment of temporary carrier wafers, proper configuration and placement of image sensor covers for optimum image quality, and formation of interconnects between image sensor bond pads and solder balls or other package contacts. Accordingly, certain conventional processing techniques, such as those disclosed in, for example, U.S. Patent Application Publication No. 2007/0194397, entitled "Photo-Sensor and Pixel Array with Backside Illumination and Method of Forming the Photo-Sensor," can suffer from increased die size, higher cost, and decreased image quality.

A need therefore exists for improved processing techniques for forming backside illuminated image sensors.

SUMMARY OF THE INVENTION

Illustrative embodiments of the invention provide backside illuminated image sensors that are easier to process, and exhibit improved performance relative to conventional sensors.

In accordance with one aspect of the invention, a process of forming a backside illuminated image sensor is provided. The process is a wafer level process for forming a plurality of image sensors each having a pixel array configured for backside illumination, with the image sensors being formed utilizing an image sensor wafer. The image sensor wafer comprises a substrate, an oxide layer formed over the substrate, a sensor layer formed over the oxide layer, and one or more dielectric layers formed over the sensor layer, with the sensor layer comprising photodiodes or other photosensitive elements of the pixel arrays. The process includes the steps of attaching a temporary carrier wafer to a frontside surface of the dielectric layer; removing the substrate to expose a backside surface of the oxide layer; forming color filter arrays on the backside surface of the oxide layer; attaching a transparent cover sheet comprising transparent covers overlying respective ones of the color filter arrays; removing the temporary carrier wafer; forming openings in the dielectric layer to expose respective bond pad conductors; forming redistribution metal conductors in electrical contact with the respective bond pad conductors through the respective openings; forming a redistribution passivation layer over the redistribution metal conductors; forming openings in the redistribution passivation layer to expose portions of respective ones of the redistribution metal conductors; and forming contact metallizations in electrical contact with the respective redistribution metal conductors in respective ones of the openings in the redistribution passivation layer. A resulting processed wafer is subsequently separated into the plurality of image sensors by dicing the wafer.

Each of the transparent covers provided by the transparent cover sheet may comprise a central cavity arranged over its corresponding color filter array and may further comprise peripheral supports secured to the backside surface of the oxide layer.

The above-described wafer level process may include additional steps in a given embodiment of the invention. For example, the process may further comprise the step of forming microlenses over respective color filter elements of the color filter arrays, the step of adding a protective film layer to the transparent cover sheet, and the step of attaching solder balls to respective ones of the contact metallizations formed in the respective openings in the redistribution passivation layer.

In accordance with another aspect of the invention, a backside illuminated image sensor comprises a sensor layer having a plurality of photosensitive elements of a pixel array, an oxide layer adjacent a backside surface of the sensor layer, and at least one dielectric layer adjacent a frontside surface of the sensor layer. A color filter array is formed on a backside surface of the oxide layer, and a transparent cover is attached to the backside surface of the oxide layer overlying the color filter array. Redistribution metal conductors are in electrical contact with respective bond pad conductors through respective openings in the dielectric layer. A redistribution passivation layer is formed over the redistribution metal conductors, and contact metallizations are in electrical contact with respective ones of the respective redistribution metal conductors through respective openings in the redistribution passivation layer.

A backside illuminated image sensor in accordance with the invention may be advantageously implemented in a digital camera or other type of imaging device, and provides improved performance in such a device without significantly increasing image sensor die size or cost. For example, use of a transparent image sensor cover with a central cavity and peripheral supports provides better image quality than conventional arrangements. Also, the illustrative embodiments overcome the drawbacks of conventional techniques with regard to use and attachment of temporary carrier wafers, and formation of interconnects between image sensor bond pads and solder balls or other package contacts.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

The present invention will be illustrated herein in conjunction with particular embodiments of digital cameras, backside illuminated image sensors, and processing techniques for forming such image sensors. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices and image sensors.

Figure 1:
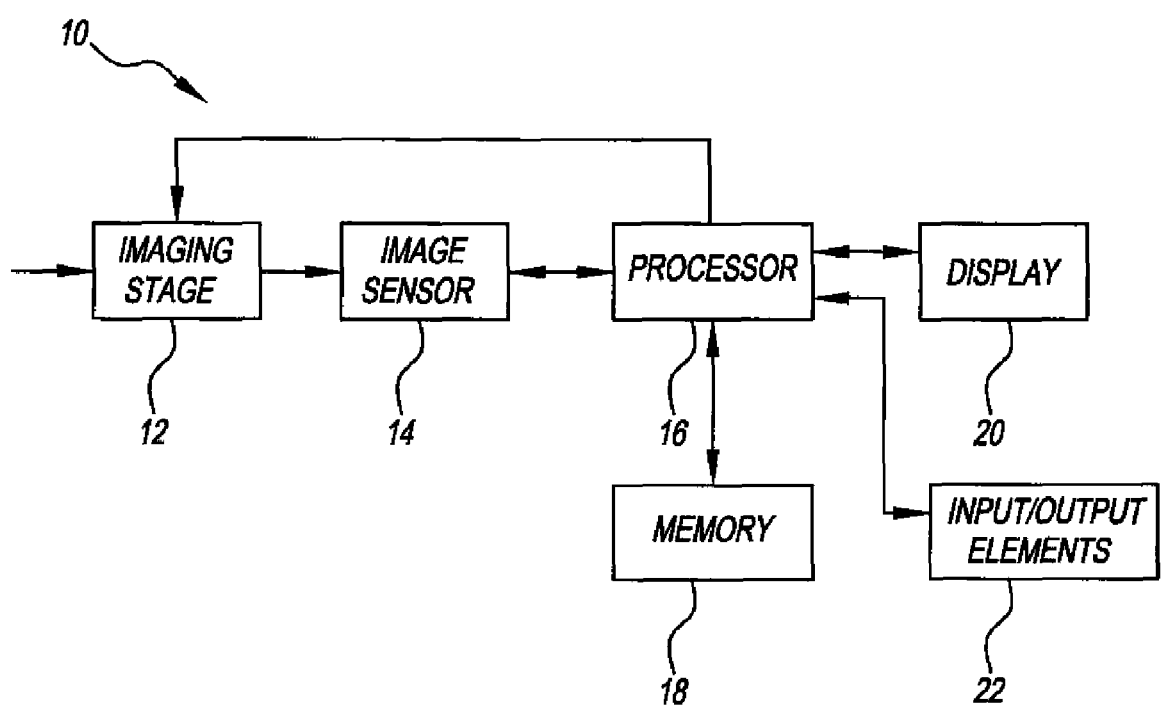
FIG. 1 is a block diagram of a digital camera having a backside illuminated image sensor configured in accordance with an illustrative embodiment of the invention.

FIG. 1 shows a digital camera 10 in an illustrative embodiment of the invention. In the digital camera, light from a subject scene is input to an imaging stage 12. The imaging stage may comprise conventional elements such as a lens, a neutral density filter, an iris and a shutter. The light is focused by the imaging stage 12 to form an image on an image sensor 14, which converts the incident light to electrical signals. The digital camera 10 further includes a processor 16, a memory 18, a display 20, and one or more additional input/output (I/O) elements 22.

Although shown as separate elements in the embodiment of FIG. 1, the imaging stage 12 may be integrated with the image sensor 14, and possibly one or more additional elements of the digital camera 10, to form a compact camera module.

The image sensor 14 is assumed in the present embodiment to be a CMOS image sensor, although other types of image sensors may be used in implementing the invention. More particularly, the image sensor 14 comprises a backside illuminated image sensor that is formed in a manner to be described below in conjunction with FIGS. 2 through 9. The image sensor generally comprises a pixel array having a plurality of pixels arranged in rows and columns and may include additional circuitry associated with sampling and readout of the pixel array, such as signal generation circuitry, signal processing circuitry, row and column selection circuitry, etc. This sampling and readout circuitry may comprise, for example, an analog signal processor for processing analog signals read out from the pixel array and an analog-to-digital converter for converting such signals to a digital form. These and other types of circuitry suitable for use in the digital camera 10 are well known to those skilled in the art and will therefore not be described in detail herein. Portions of the sampling and readout circuitry may be arranged external to the image sensor, or formed integrally with the pixel array, for example, on a common integrated circuit with photodiodes and other elements of the pixel array.

The image sensor 14 will typically be implemented as a color image sensor having an associated CFA pattern. Examples of CFA patterns that may be used with the image sensor 14 include those described in the above-cited U.S. Patent Application Publication No. 2007/0024931, although other CFA patterns may be used in other embodiments of the invention. As another example, a conventional Bayer pattern may be used, as disclosed in U.S. Pat. No. 3,971,065, entitled "Color Imaging Array," which is incorporated by reference herein.

The processor 16 may comprise, for example, a microprocessor, a central processing unit (CPU), an application-specific integrated circuit (ASIC), a digital signal processor (DSP), or other processing device, or combinations of multiple such devices. Various elements of the imaging stage 12 and the image sensor 14 may be controlled by timing signals or other signals supplied from the processor 16.

The memory 18 may comprise any type of memory, such as, for example, random access memory (RAM), read-only memory (ROM), Flash memory, disk-based memory, removable memory, or other types of storage elements, in any combination.

Functionality associated with sampling and readout of the pixel array and the processing of corresponding image data may be implemented at least in part in the form of software that is stored in memory 18 and executed by processor 16.

A given image captured by the image sensor 14 may be stored by the processor 16 in memory 18 and presented on display 20. The display 20 is typically an active matrix color liquid crystal display (LCD), although other types of displays may be used. The additional I/O elements 22 may comprise, for example, various on-screen controls, buttons or other user interfaces, network interfaces, memory card interfaces, etc.

Additional details regarding the operation of a digital camera of the type shown in FIG. 1 can be found, for example, in the above-cited U.S. Patent Application Publication No. 2007/0024931.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or imaging devices. Also, as mentioned above, certain aspects of the embodiments described herein may be implemented at least in part in the form of software executed by one or more processing elements of an imaging device. Such software can be implemented in a straightforward manner given the teachings provided herein, as will be appreciated by those skilled in the art The image sensor 14 may be fabricated on a silicon substrate or other type of substrate. In a typical CMOS image sensor, each pixel of the pixel array includes a photodiode and associated circuitry for measuring the light level at that pixel. Such circuitry may comprise, for example, transfer gates, reset transistors, select transistors, output transistors, and other elements, configured in a well-known conventional manner.

As indicated above, FIGS. 2 through 9 illustrate the process of forming the backside illuminated image sensor 14 in one embodiment of the present invention. It should be noted that these figures are simplified in order to clearly illustrate various aspects of the present invention, and are not necessarily drawn to scale. A given embodiment may include a variety of other features or elements that are not explicitly illustrated but would be familiar to one skilled in the art as being commonly associated with image sensors of the general type described.

Figure 2:
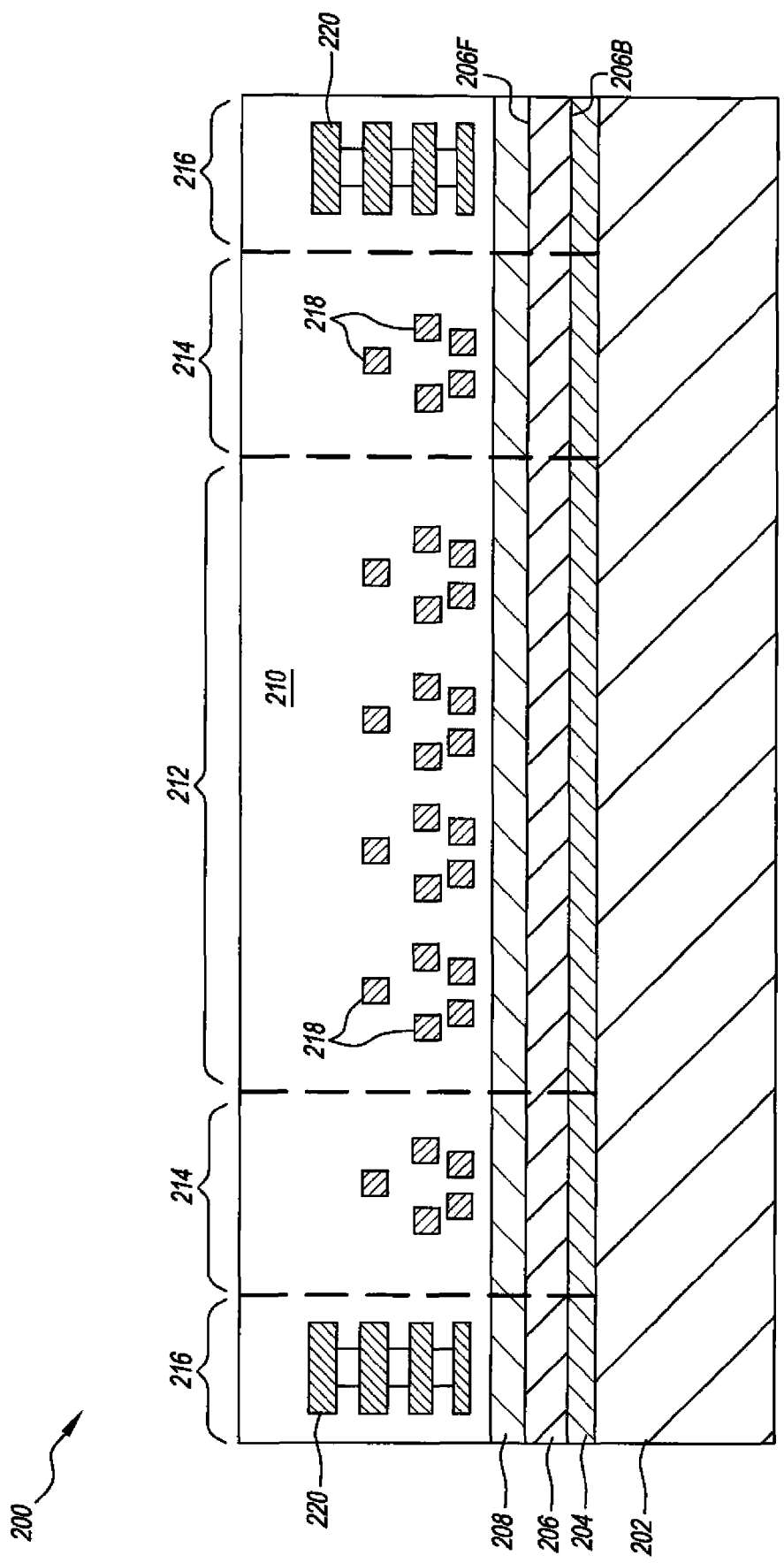
FIGS. 2 through 9 are cross-sectional views showing portions of a backside illuminated image sensor at various steps in an exemplary process for forming such an image sensor, in accordance with an illustrative embodiment of the invention.

FIG. 2 shows a portion of an image sensor wafer 200 at the completion of a number of initial steps of an exemplary CMOS process flow. The image sensor wafer 200 at this stage comprises a silicon substrate 202, a buried oxide (BOX) layer 204 formed over the substrate, a silicon sensor layer 206 formed over the oxide layer, and dielectric layers 208, 210 formed over the sensor layer. The dielectric layer 208 is an interlayer dielectric (ILD), and the dielectric layer 210 is an intermetal dielectric (IMD) that separates multiple levels of metallization. The ILD and IMD layers may alternatively be viewed as collectively forming a single dielectric layer. Various image sensor features such as interconnects, gates or other circuitry elements may be formed within a given dielectric layer using conventional techniques.

As will be described, the image sensor wafer 200 is further processed to form a plurality of image sensors each having a pixel array configured for backside illumination. The portion of the image sensor wafer 200 as shown in FIG. 2 generally corresponds to a particular one of the image sensors, and includes a pixel array area 212 surrounded by periphery areas 214 and bond pad areas 216. The areas 212 and 214 include conductors 218 associated with various levels of metallization in the IMD layer 210. Similarly, the bond pad areas 216 include conductors 220 associated with multiple IMD metallization levels. The sensor layer 206 includes photodiodes and associated circuitry of the pixel array.

The image sensor wafer 200 has a frontside and a backside as indicated in FIG. 2. As described previously herein, the frontside refers generally to the side of an image sensor on which dielectric layers and associated levels of metallization are formed, while the side having the silicon substrate is referred to as the backside. The terms "frontside" and "backside" will be used herein to denote particular sides of an image sensor wafer or an image sensor formed from such a wafer, as well as sides of particular layers of the image sensor wafer or corresponding image sensor. For example, the sensor layer 206 has a frontside surface 206F and a backside surface 206B. As mentioned above, the illustrative embodiments relate to backside illuminated image sensors, that is, image sensors in which light from a subject scene is incident on the photodiodes or other photosensitive elements of the pixel array from a backside of the sensor.

It should be noted that terms such as "on" or "over" when used in conjunction with layers of an image sensor wafer or corresponding image sensor are intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

The image sensor wafer 200 illustrated in FIG. 2 is an example of a silicon-on-insulator (SOI) wafer. In such a wafer, the thickness of the silicon sensor layer 206 may be approximately 1 to 6 micrometers (μm), and the thickness of the buried oxide layer 204 may be approximately 0.1 to 0.5 μm, although other thicknesses may be used. The silicon substrate 202 is typically substantially thicker than the sensor layer or buried oxide layer. Alternative embodiments of the invention may utilize other types of wafers to form backside illuminated image sensors, such as, for example, epitaxial wafers or bulk semiconductor wafers that do not include a buried oxide layer, although an SOI wafer generally provides a smoother surface for backside processing.

The image sensor wafer 200 is further processed in the manner shown in FIGS. 3 through 9 in order to form the backside illuminated image sensor 14 of FIG. 1.

Figure 3:
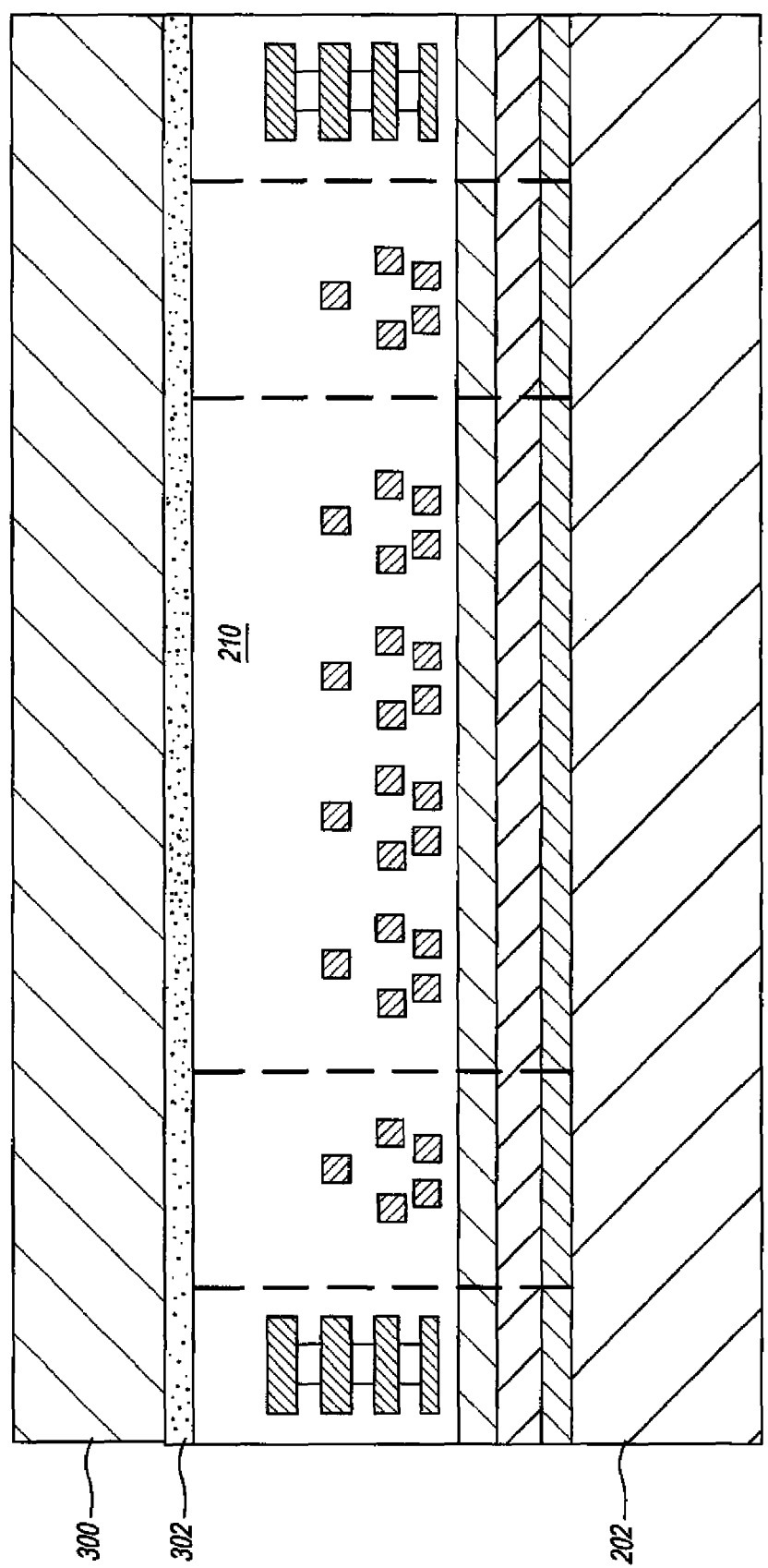

In the step illustrated in FIG. 3, a temporary carrier wafer 300 is attached to a frontside surface of the IMD layer 210 using epoxy 302. The temporary carrier wafer 300 may comprise, for example, a type of wafer commonly referred to as a handle wafer.

Figure 4:
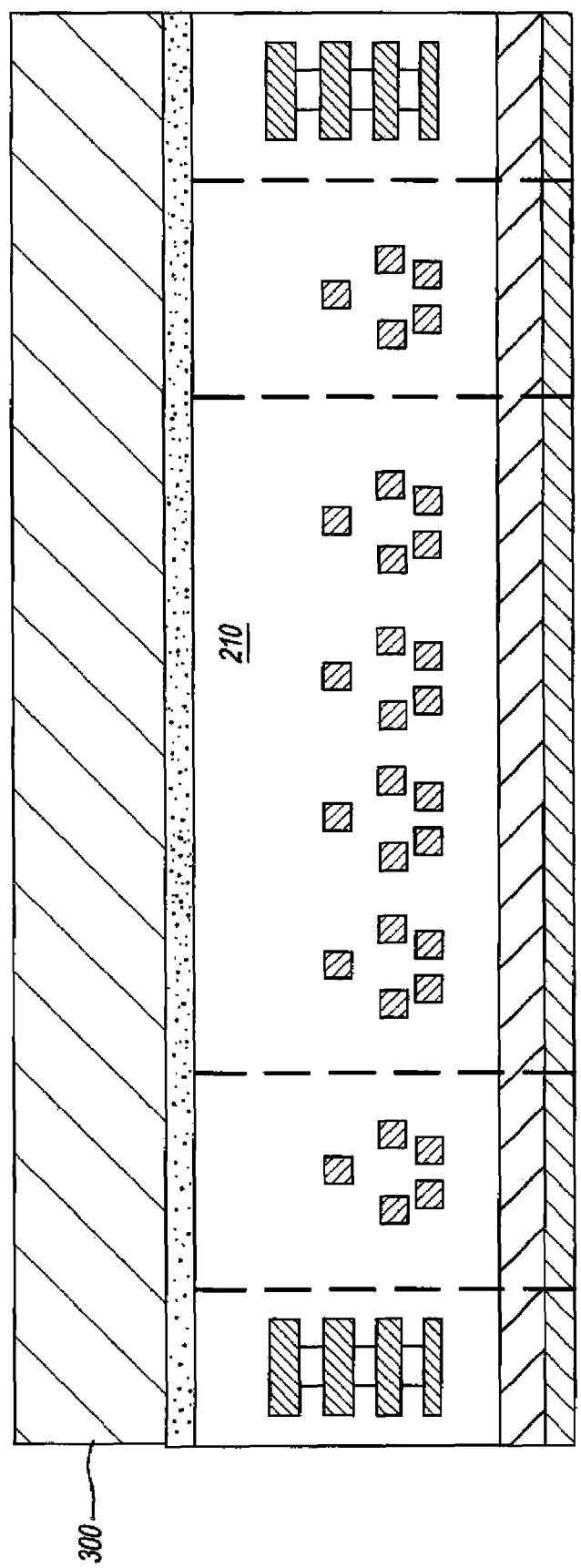

The silicon substrate 202 is then removed, resulting in the image sensor wafer structure as illustrated in FIG. 4. The substrate may be removed using, for example, grinding, polishing or etching techniques, in any combination. Typically, the substrate is removed in its entirety, exposing the buried oxide layer at the backside of the wafer. In an alternative embodiment, such as one involving an epitaxial or bulk semiconductor wafer, the substrate may be thinned rather than completely removed.

Figure 5:
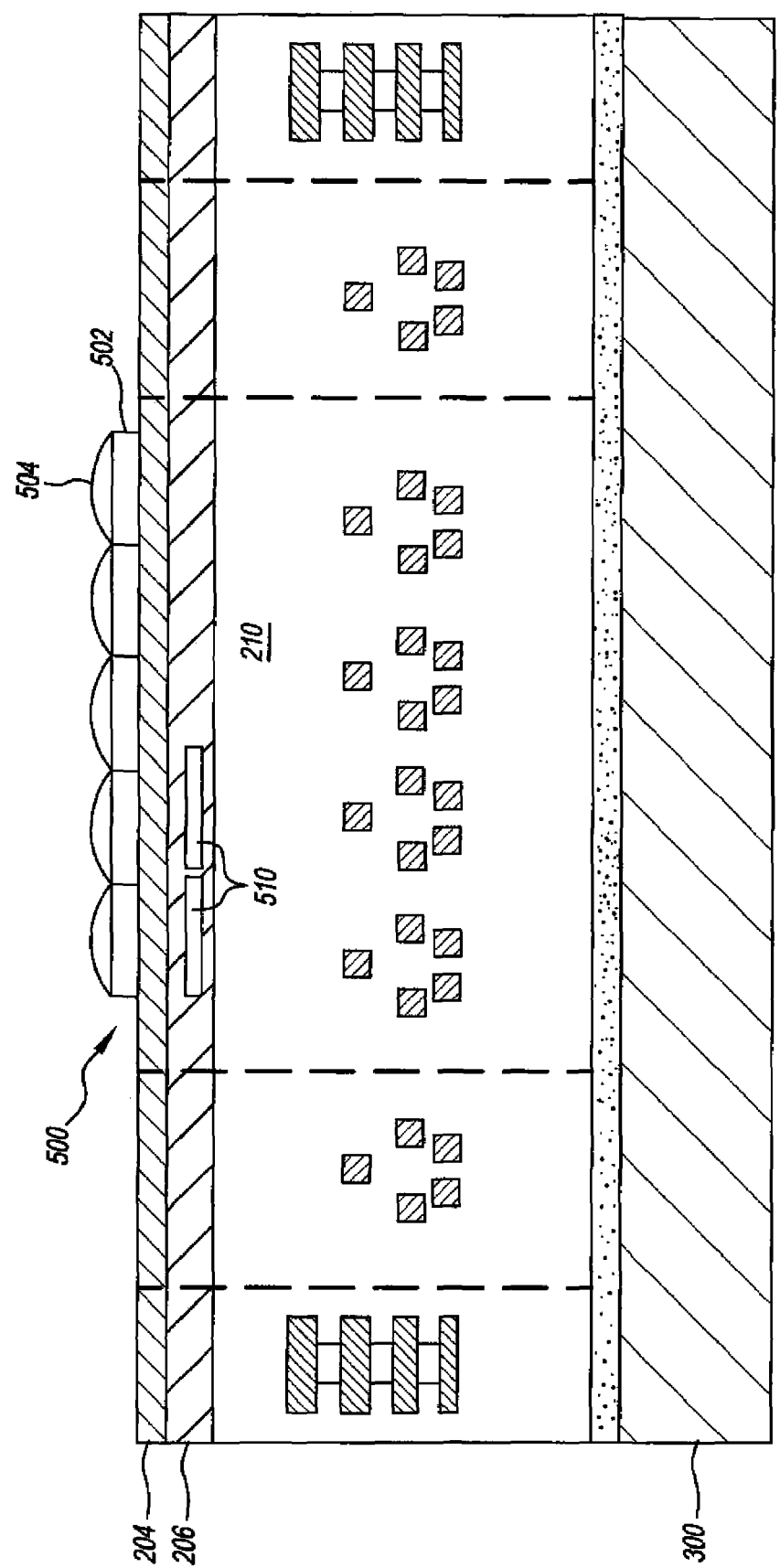

After removal of the substrate, the structure is flipped over and CFAs and associated microlenses are formed on the backside surface of the buried oxide layer 204 as shown in FIG. 5. The temporary carrier wafer 300 serves as a substrate at this stage, providing support for the structure after the removal of the original substrate 202. Generally, each of the pixel arrays of the image sensor wafer has a corresponding CFA 500 which includes color filter elements 502 that are arranged over respective photosensitive elements 510 of the sensor layer 206. As indicated previously herein, the photosensitive elements may comprise photodiodes. Such elements may be part of the image sensor wafer 200 as shown in FIG. 2, and formed in a conventional manner, but are omitted from that figure and other figures herein for clarity of illustration. Also associated with each of the color filter elements 502 of the CFA 500 is a corresponding microlens 504. The color filter elements and associated microlenses may be aligned with the photosensitive elements of the sensor layer using alignment marks, although such marks are not shown. Advantageous techniques for forming alignment marks in a backside illuminated image sensor are disclosed in the above-cited U.S. Patent Application Kodak Docket No. 94870.

Figure 6:
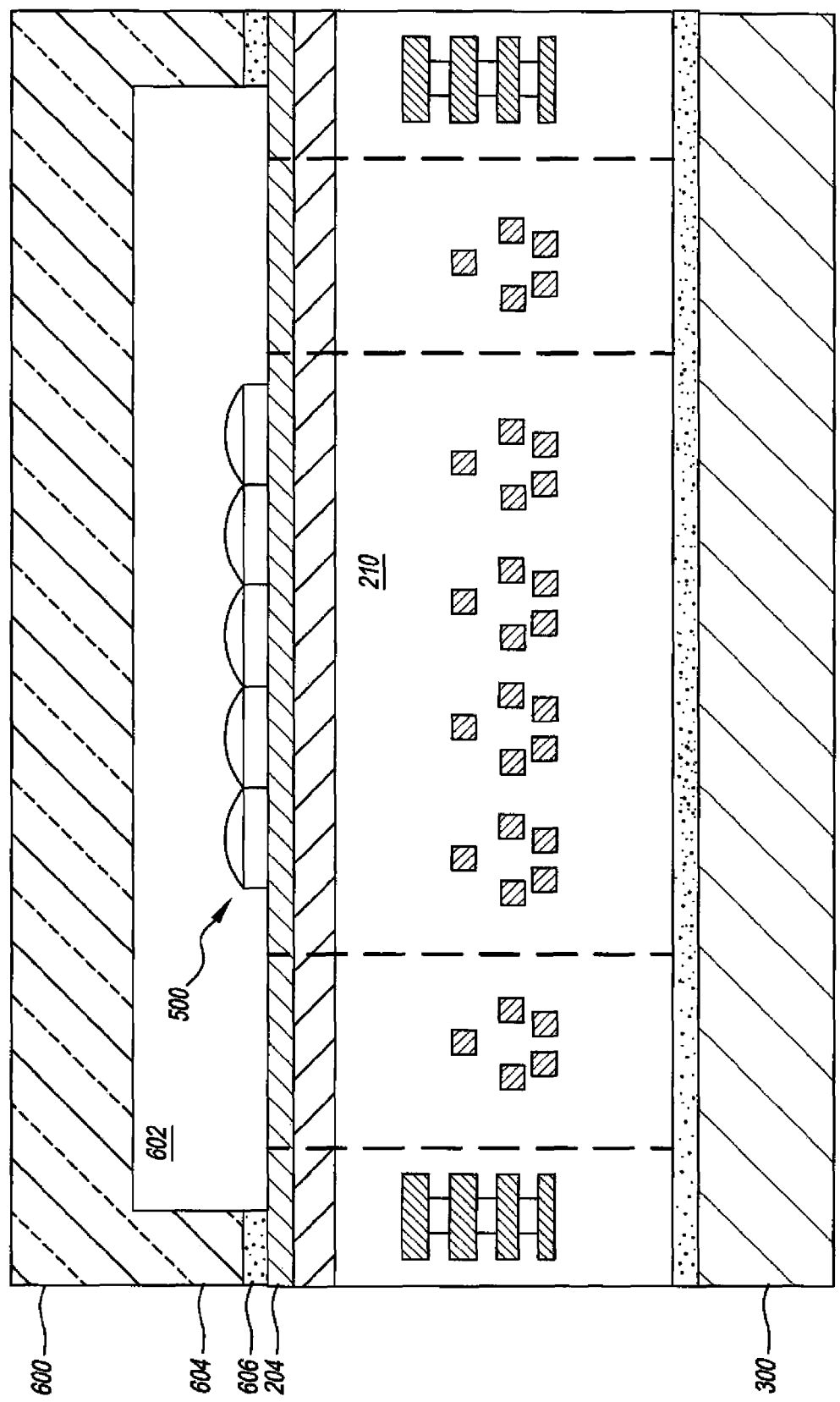

A glass cover sheet 600 is then attached to the backside surface of the buried oxide layer 204 as illustrated in FIG. 6. The cover sheet 600 generally comprises a plurality of glass covers overlying respective ones of the CFAs 500 of the image sensor wafer 200. In the portion of the image sensor wafer shown in FIG. 6, a given such glass cover overlies the CFA 500 formed on the backside surface of the buried oxide layer. Each of the glass covers may be viewed as generally comprising a central cavity 602 arranged over its corresponding CFA and further comprising peripheral supports 604 secured to the backside surface of the oxide layer 204 via epoxy 606. Although the cover sheet is formed of glass in this example, other types of transparent materials may be used in other embodiments. The glass cover sheet is generally attached to the wafer as a single sheet which is divided into separate covers when the image sensors are diced from the wafer as will be described below. The central cavity 602 in the present embodiment is at least about 25 μm deep, and more particularly on the order of 50 μm deep, as measured from the top of the CFA 500 to an inside lower surface of the overlying glass cover. Each of the peripheral supports may be at least about 300 μm wide, as measured after dicing of the wafer but in the same cross-sectional direction shown in FIG. 6. Again, other dimensions may be used in other embodiments.

Figure 7:
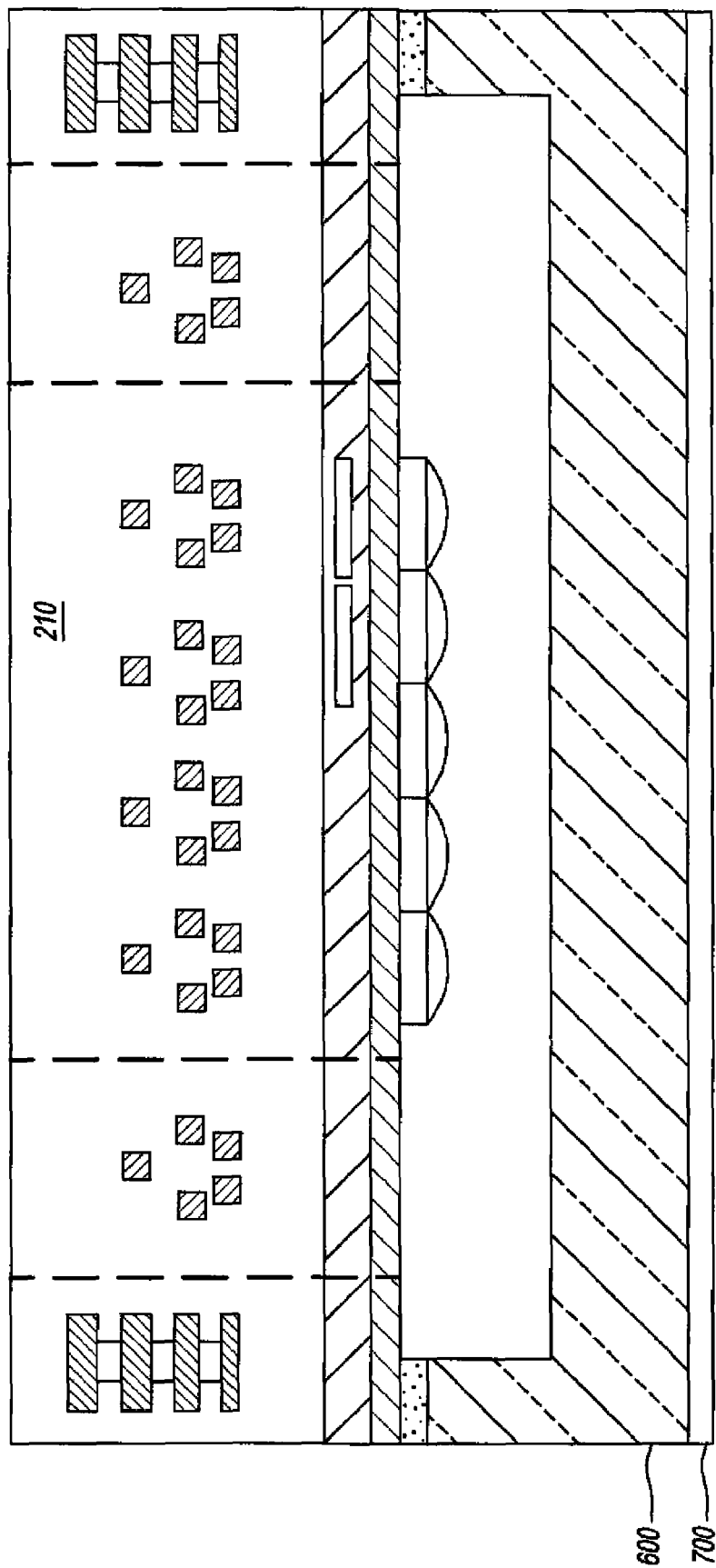

As illustrated in FIG. 7, a protective film layer 700 is added to the glass cover sheet 600. The structure is then flipped, and the temporary carrier wafer 300 is removed. Thus, the glass cover sheet previously attached to the image sensor wafer 200 provides sufficient support for the remaining process steps to allow the temporary carrier wafer to be removed.

Figure 8:
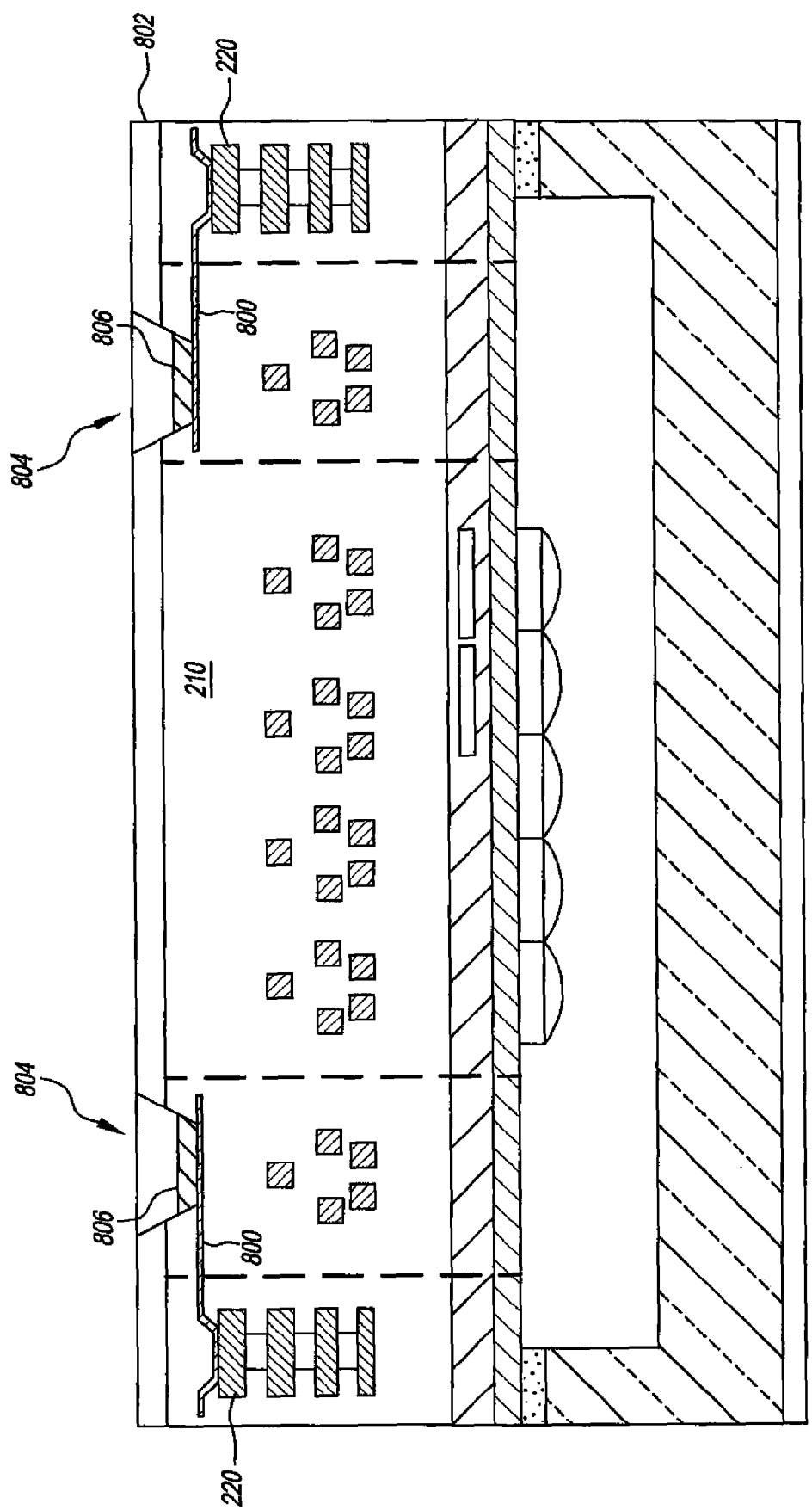

FIG. 8 illustrates the image sensor wafer 200 after a number of additional process steps. Initially, openings are formed in the IMD layer 210 to expose respective ones of the bond pad conductors 220. Then, redistribution layer (RDL) metal conductors 800 are formed in electrical contact with the respective bond pad conductors 220 through the respective openings in the IMD layer. An RDL passivation layer 802 is formed over the RDL metal conductors 800, and openings 804 are formed in the RDL passivation layer to expose portions of the underlying RDL metal conductors. Contact metallizations 806 are then formed in electrical contact with the RDL metal conductors 800 in respective ones of the openings 804 in the RDL passivation layer. The contact metallizations in this example are referred to as under-ball metallization (UBM), and are also denoted as UBM metallizations in the figure. The routing of the RDL metal allows the use of solder balls in arrangements in which the bond pad conductors would otherwise be too close to one another to accommodate the solder ball pitch.

Figure 9:
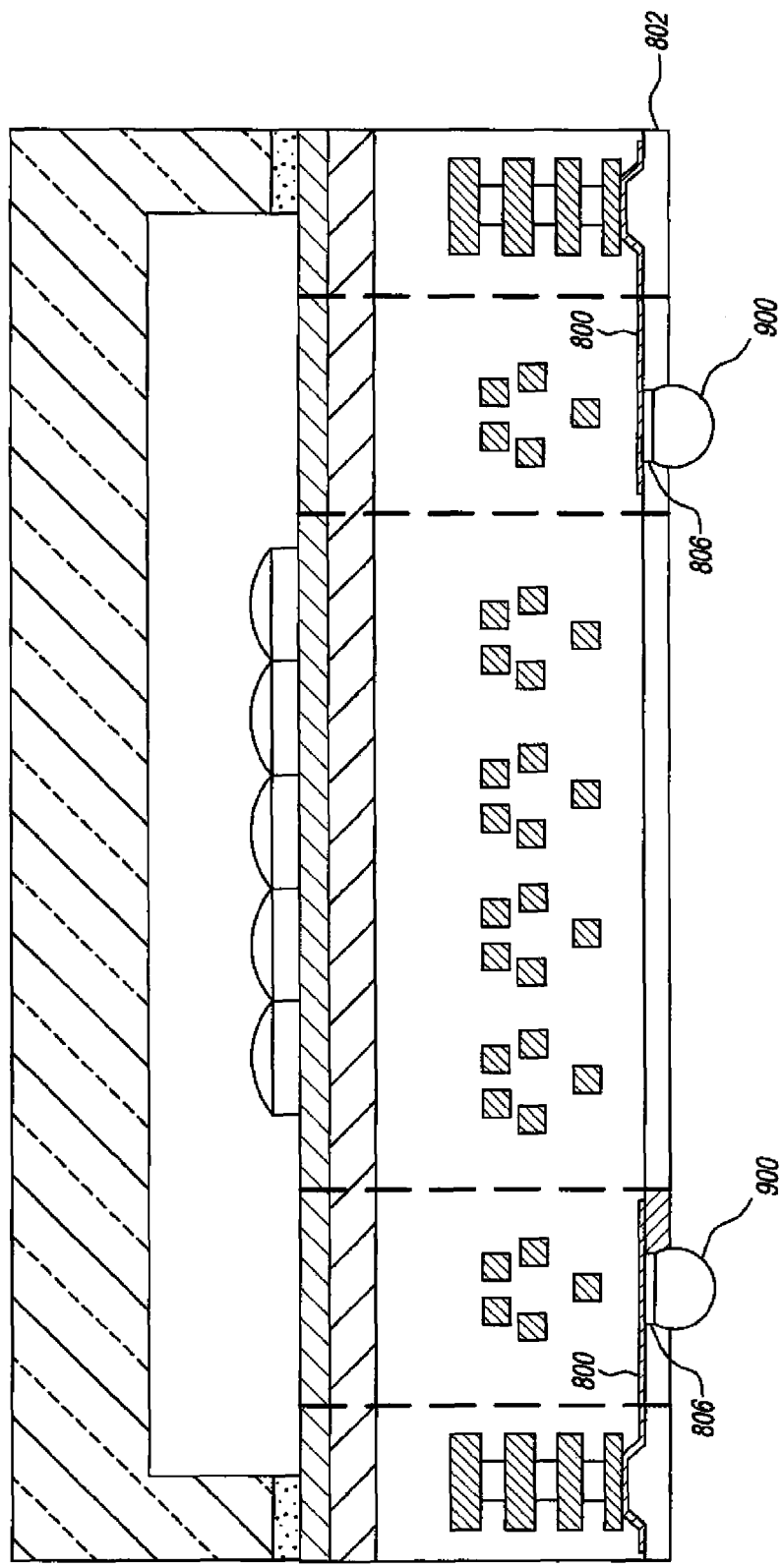

FIG. 9 shows the addition of solder balls 900 in the openings 804 in contact with the contact metallizations 806. The image sensor wafer 200 has also been flipped, and the protective film layer 700 has been removed. The term "solder ball" as used herein is intended to be construed generally so as to encompass solder bumps or other solder arrangements.

The processed image sensor wafer 200 is now ready for dicing into a plurality of image sensors 14 configured for backside illumination. Alternatively, dicing can be done earlier in the process, for example, prior to the addition of the solder balls 900 and the removal of the protective film layer 700 from the glass cover sheet 600.

Figure 10:
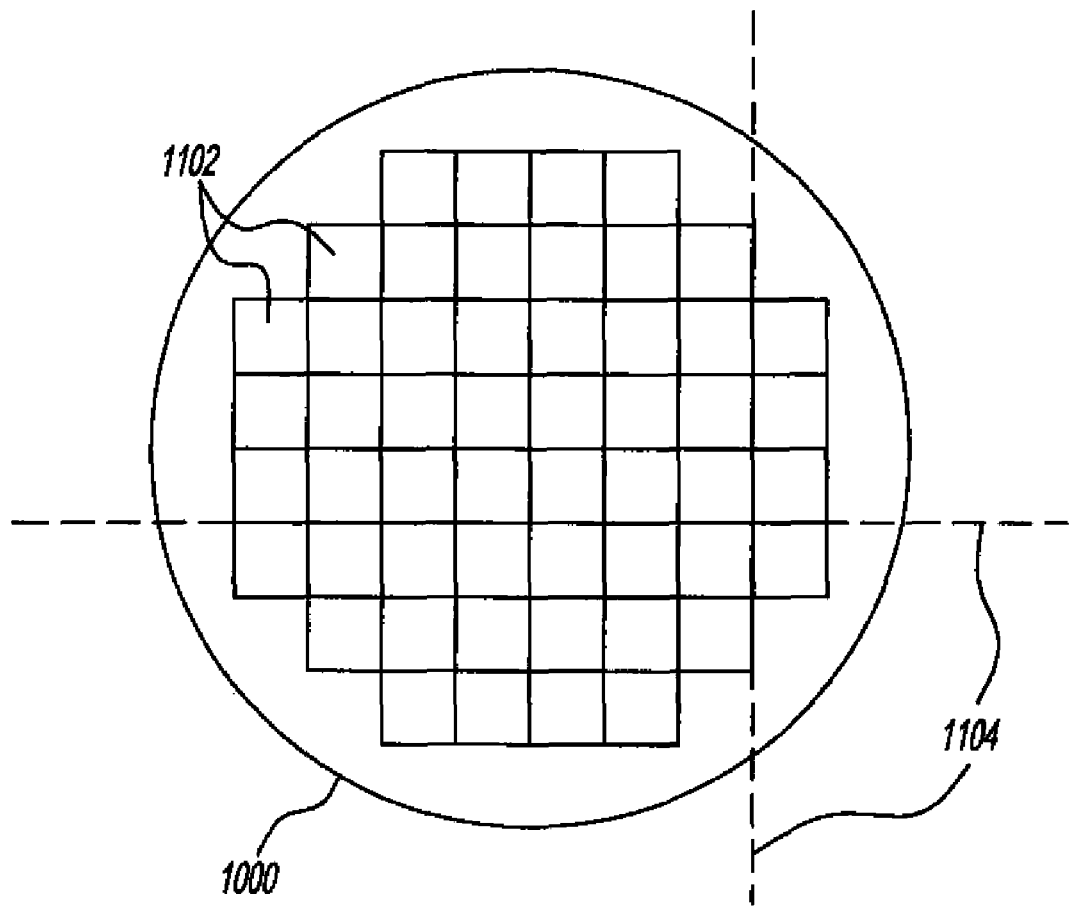
FIG. 10 is a plan view of an image sensor wafer comprising multiple image sensors formed using the exemplary process of FIGS. 2 through 9.

FIG. 10 shows a plan view of a given processed image sensor 1000 prior to dicing. The image sensor wafer 1000 comprises a plurality of image sensors 1002. The image sensors 1002 are formed through wafer level processing operations of the type described in conjunction with FIGS. 2 through 9. The image sensors are then separated from one another by dicing the wafer along dicing lines 1004. A given one of the image sensors 1002 corresponds to image sensor 14 in digital camera 10 of FIG. 1.

The above-described illustrative embodiments advantageously provide an improved processing arrangement for forming a backside illuminated image sensor. For example, handling issues relating to the thinning or removal of the silicon substrate are addressed in an efficient manner, without substantially increasing the die size or cost of the resulting image sensor. Also, the use of a glass cover with a cavity overlying the CFA elements and microlenses of a given pixel array provides enhanced image quality. Moreover, the use of RDL metal conductors to facilitate placement of solder balls provides for a more efficient packaging arrangement.

The invention has been described in detail with particular reference to certain illustrative embodiments thereof, but it will be understood that variations and modifications can be effected within the scope of the invention as set forth in the appended claims. For example, the invention can be implemented in other types of image sensors and digital imaging devices, using alternative materials, wafers, layers, process steps, etc. These and other alternative embodiments will be readily apparent to those skilled in the art.

| PARTS LIST | |
|---|---|
| 10 | digital camera |
| 12 | imaging stage |
| 14 | backside illuminated image sensor |
| 16 | processor |
| 18 | memory |
| 20 | display |
| 22 | input/output (I/O) elements |
| 200 | image sensor wafer |
| 202 | substrate |
| 204 | buried oxide (BOX) layer |
| 206 | sensor layer |
| 206B | sensor layer backside surface |
| 206F | sensor layer frontside surface |
| 208 | interlayer dielectric (ILD) |
| 210 | intermetal dielectric (IMD) |
| 212 | pixel array area |
| 214 | periphery area |
| 216 | bond pad area |
| 218 | conductors |
| 220 | conductors |
| 300 | temporary carrier wafer |
| 302 | epoxy |
| 500 | color filter array (CFA) |
| 502 | color filter element |
| 504 | microlens |
| 510 | photosensitive elements |
| 600 | glass cover sheet |
| 602 | central cavity |
| 604 | peripheral support |
| 606 | epoxy |
| 700 | protective film |
| 800 | redistribution layer (RDL) conductors |
| 802 | RDL passivation layer |
| 804 | RDL openings |
| 806 | under-ball metallization (UBM) |
| 900 | solder balls |
| 1000 | image sensor wafer |
| 1002 | image sensors |
| 1004 | dicing lines |

The invention claimed is:

1. An image sensor having a pixel array configured for backside illumination, comprising:

a sensor layer comprising a plurality of photosensitive elements of the pixel array;

an oxide layer adjacent a backside surface of the sensor layer;

at least one dielectric layer adjacent a frontside surface of the sensor layer;

a color filter array formed on a backside surface of the oxide layer;

a transparent cover attached to the backside surface of the oxide layer and overlying the color filter array;

redistribution metal conductors in electrical contact with respective bond pad conductors through respective openings in said at least one dielectric layer;

a redistribution passivation layer formed over the redistribution metal conductors; and contact metallizations in electrical contact with respective ones of the respective redistribution metal conductors through respective openings in the redistribution passivation layer.

2. The image sensor of claim 1 wherein the transparent cover comprises a central cavity arranged over the color filter array and further comprises peripheral supports secured to the backside surface of the oxide layer.

3. The image sensor of claim 1 further comprising solder balls attached to respective ones of the contact metallizations in the respective openings in the redistribution passivation layer.

4. The image sensor of claim 1 wherein the transparent cover comprises a glass cover.

5. The image sensor of claim 1 wherein the contact metallizations comprise under-ball metallizations.

6. The image sensor of claim 1 wherein said at least one dielectric layer comprises an interlayer dielectric and further comprises an intermetal dielectric separating multiple levels of metallization.

7. The image sensor of claim 1 wherein said image sensor comprises a CMOS image sensor.

* * * * *